US012774207B2

(12) United States Patent
Wu et al.

(10) Patent No.: US 12,774,207 B2
(45) Date of Patent: Oct. 27, 2026

(54) SEMICONDUCTOR DEVICES AND METHODS OF MANUFACTURE

(71) Applicant: Taiwan Semiconductor Manufacturing Co., Ltd., Hsinchu (TW)

(72) Inventors: Yun-Chung Wu, Taipei City (TW); Jhao-Yi Wang, Tainan (TW); Hao Chun Yang, New Taipei City (TW); Pei-Wei Lee, Kaohsiung City (TW); Wen-Hsiung Lu, Tainan City (TW)

(73) Assignee: Taiwan Semiconductor Manufacturing Co., Ltd., Hsinchu (TW)

(*) Notice: Subject to any disclaimer, the term of this patent is extended or adjusted under 35 U.S.C. 154(b) by 682 days.

(21) Appl. No.: 18/152,511

(22) Filed: Jan. 10, 2023

(65) Prior Publication Data

US 2024/0124298 A1 Apr. 18, 2024

Related U.S. Application Data

(60) Provisional application No. 63/416,187, filed on Oct. 14, 2022.

(51) Int. Cl.

*B81C 1/00* (2006.01)
*B81B 7/00* (2006.01)

(52) U.S. Cl.

CPC ........ *B81C 1/00095* (2013.01); *B81B 7/0006* (2013.01); *B81B 2207/07* (2013.01)

(58) Field of Classification Search

CPC ........ B81C 1/00095; B81C 2203/0792; B81B 7/0006; B81B 7/007; B81B 2207/07; B81B 2207/092; B81B 2207/097

See application file for complete search history.

(56) References Cited

U.S. PATENT DOCUMENTS

2015/0108002 A1* 4/2015 Kim ........................ C25D 1/003 205/122
2017/0047307 A1* 2/2017 Uzoh .................... H10W 72/20
2017/0275153 A1* 9/2017 Chen ........................ B81B 7/007
2017/0297901 A1* 10/2017 Huang .................. B81B 3/0086
2017/0316957 A1* 11/2017 Chen ................... H10W 74/017
2021/0047175 A1* 2/2021 Chu ....................... B81B 7/0035
2021/0098348 A1* 4/2021 Koduri ................... H10D 1/692

* cited by examiner

*Primary Examiner* — Moazzam Hossain
(74) *Attorney, Agent, or Firm* — Slater Matsil, LLP

(57) ABSTRACT

Microelectromechanical devices and methods of manufacture are presented. Embodiments include bonding a mask substrate to a first microelectromechanical system (MEMS) device. After the bonding has been performed, the mask substrate is patterned. A first conductive pillar is formed within the mask substrate, and a second conductive pillar is formed within the mask substrate, the second conductive pillar having a different height from the first conductive pillar. The mask substrate is then removed.

20 Claims, 9 Drawing Sheets

SEMICONDUCTOR DEVICES AND METHODS OF MANUFACTURE

PRIORITY CLAIM AND CROSS-REFERENCE

This application claims the benefit of U.S. Provisional Application No. 63/416,187, filed on Oct. 14, 2022, which application is hereby incorporated herein by reference.

BACKGROUND

Microelectromechanical system (MEMS) devices have been recently utilized in order to obtain devices with variable physical properties. Examples of these MEMS devices include devices with variable physical properties, such as accelerometers, digital micromirror devices (DMDs), and devices with variable electrical properties, such as variable capacitors or variable inductors. Generally, each of these MEMS devices comprises a moveable piece whose movement, when actuated by, e.g., an electrode, causes a change in the variable property of the device.

Generally, well-known semiconductor manufacturing techniques have been utilized to great effect in forming these moveable pieces within the MEMS devices. Using these techniques, parts which are intended to be moveable are initially manufactured as an immoveable layer. Following the completion of the manufacturing of the moveable piece, the moveable layer is patterned, thereby freeing the moveable piece to move.

Additionally, to meet customer demands for smaller and smaller devices, the MEMS devices also need to be reduced in size so that they fit into the desired packages (e.g., mobile phones, music players, etc.). However, in this race to manufacture devices as small as possible to meet customer demands, technological improvements must improve as well. In particular, as sizes are scaled down, issues that were previously acceptable at larger sizes become more critical and can actually impact performance or yield of a production process or even the performance of the finished devices themselves.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
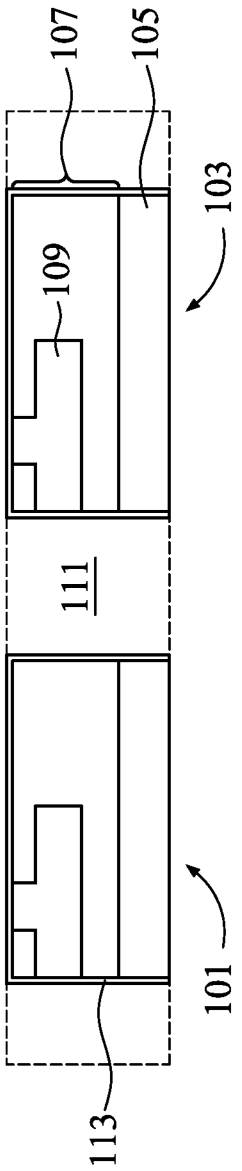
FIG. 1 illustrates a first MEMS devices and a second MEMS device, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as “beneath,” “below,” “lower,” “above,” “upper” and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments will now be described with respect to particular embodiments in which a masking material is bonded or otherwise attached to devices and patterned in order to be used as a mask during subsequent plating processes. However, the embodiments described herein are intended to be illustrative and are not intended to limit the ideas to the precise embodiments presented. Rather, the ideas presented may be implemented within a wide variety of embodiments, and all such embodiments are fully intended to be included within the scope.

With reference now to FIG. 1, there is illustrated a first microelectromechanical system (MEMS) device 101 and a second MEMS device 103 adjacent to the first MEMS device 101. In an embodiment the first MEMS device 101 and the second MEMS device 103 may be individual dies or different sections of a single die. In some embodiments the first MEMS device 101 and the second MEMS device 103 may each comprise a semiconductor substrate 105, MEMS units (not separately illustrated within FIG. 1) and/or other CMOS devices formed either within or over the semiconductor substrate 105, metallization layers 107 over the semiconductor substrate 105, and a top metal layer 109 within the metallization layers 107.

The semiconductor substrate 105 may comprise bulk silicon, doped or undoped, or an active layer of a silicon-on-insulator (SOI) substrate. Generally, an SOI substrate comprises a layer of a semiconductor material such as silicon, germanium, silicon germanium, SOI, silicon germanium on insulator (SGOI), or combinations thereof. Other substrates that may be used include multi-layered substrates, gradient substrates, or hybrid orientation substrates.

The first MEMS device 101 and the second MEMS device 103 may optionally comprise active devices (not separately illustrated) and passive devices such as CMOS devices in order to provide a desired functionality for the first MEMS device 101 and the second MEMS device 103. However, as one of skill in the art will recognize, a wide variety of active devices such as transistors, capacitors, resistors, inductors and the like may be used to generate the desired structural and functional requirements of the design for the first MEMS device 101 and the second MEMS device 103. The active devices may be formed using any suitable methods either within or else on the surface of the semiconductor substrate.

The MEMS devices may be formed either simultaneously with or separately from the active devices. In an embodiment the MEMS devices may be MEMS devices such as accelerometers, gyroscopes, microphones, motion sensors, pressure sensors, rotating mirrors as part of a digital micromirror device, capacitor plates as part of a variable capacitance capacitor, combinations of these, or the like, and may be formed using any suitable methods.

The metallization layers 107 are formed over the semiconductor substrate 105, the active devices, and the MEMS devices and are designed to connect the various devices to form functional circuitry. The metallization layers 107 are formed of alternating layers of dielectric and conductive material and may be formed through any suitable process (such as deposition, damascene, dual damascene, etc.). In an embodiment the precise number of metallization layers 107 is dependent upon the design of the first MEMS device 101 and the second MEMS device 103, and any suitable number of metallization layers may be utilized.

As part of the metallization layers, a top metal layer 109 is formed as a top most layer within the metallization layers 107. In an embodiment the top metal layer 109 includes a dielectric layer and conductive features formed within the dielectric layer. The top metal layer 109 may be formed by initially depositing the dielectric layer over a top surface of underlying layers of the metallization layers. The dielectric layer may be deposited by chemical vapor deposition (CVD), physical vapor deposition (PVD), or the like. The dielectric layer may comprise a dielectric material such as silicon oxide, SiCOH, combinations of these, or the like. However, any suitable material may be utilized.

Once the dielectric layer has been formed, the dielectric layer may then be etched to form openings exposing a top surface of the underlying layers of the metallization layers. In an embodiment the dielectric layer may be etched using, e.g., a first masking and etching process to form the openings. Once the openings have been formed, the conductive features may be formed by depositing conductive material in the openings using, for example, a plating process. In an embodiment the conductive material may be copper, a copper alloy, aluminum, an aluminum alloy, combinations of these, or the like. However, any suitable material and any suitable process of formation may be utilized.

Once the openings have been filled and/or overfilled by the conductive material, the conductive features may be formed by removing excess material from outside of the openings. In an embodiment the removal may be performed using a planarization process such as a chemical mechanical polishing (CMP) process. However, any suitable removal process may be utilized.

Further, if desired, the above process steps may be repeated in order to form overlying structures is any desired shape. Also, other processes, such as dual damascene processes may be utilized. All such processes are fully intended to be included in the scope of the embodiments.

Once the top metal 109 has been formed, and in embodiments in which the first MEMS device 101 and the second MEMS device 103 are formed within a same semiconductor substrate and formed as part of a single die, via openings 111 may be formed between the first MEMS device 101 and the second MEMS device 103. In an embodiment the via openings 111 may be formed using, e.g., a photolithographic masking and etching process. However, any suitable process may be utilized.

Once the via openings 111 have been formed, a first seed layer 113 may be deposited to cover sidewalls and top surfaces of the first MEMS device 101 and the second MEMS device 103. In an embodiment the first seed layer 113 is a thin layer of a conductive material that aids in the formation of a thicker layer during subsequent processing steps. The first seed layer 113 may comprise a layer of titanium about 1,000 Å thick followed by a layer of copper about 5,000 Å thick. The first seed layer 113 may be created using processes such as sputtering (PVD), evaporation, or PECVD processes, depending upon the desired materials. The first seed layer 113 may be formed to have a thickness of between about 0.3 μm and about 1 μm, such as about 0.5 μm.

Figure 2:
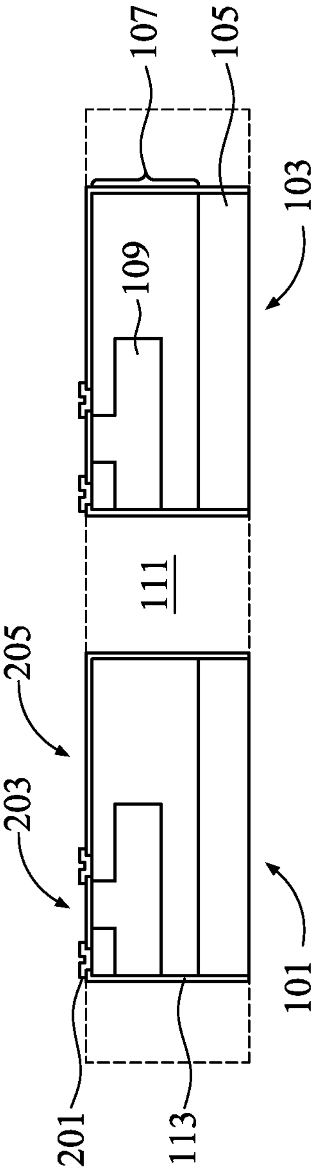
FIG. 2 illustrates formation of seed layer separators, in accordance with some embodiments.

FIG. 2 illustrates formation of a seed layer separator 201 through at least a portion of the first seed layer 113. In an embodiment the seed layer separators 201 are formed and subsequently removed (not discussed in FIG. 2 but illustrated and discussed further below with respect to FIG. 9) so as to electrically isolate one portion of the first seed layer 113 from a second portion of the first seed layer 113 once overlying structures have been formed. To form the seed layer separator 201, and in an embodiment in which the first seed layer 113 is a bi-layer of titanium and copper, a first opening is formed through at least the layer of copper and, optionally, the layer of titanium, using, e.g., a photolithographic masking and etching process.

Once the material of the seed layer separators 201 has been deposited, the material of the seed layer separators 201 is patterned to form the seed layer separators 201. In an embodiment the material of the seed layer separators 201 may be patterned using, e.g., a photolithographic masking and etching process. However, any suitable method may be utilized.

Once the opening has been formed, the seed layer separator 201 may be formed to extend through the openings. In an embodiment the seed layer separator 201 may be formed by depositing a conductive material such as titanium, copper, titanium nitride, combinations of these, or the like, using a deposition process such as chemical vapor deposition, physical vapor deposition, atomic layer deposition, combinations of these, or the like. However, any suitable material and any suitable deposition process may be utilized.

Once the material of the seed layer separators 201 has been deposited, the material of the seed layer separators 201 is patterned to form the seed layer separators 201 in a desired shape. In a particular embodiment the seed layer separators 201 may be formed in a circular shape in a top down view (two portions of which are visible in the cross-section illustrated in FIG. 3, which portions are connected through cross-sections not visible in FIG. 3), although any suitable shapes may be utilized. In an embodiment the material of the seed layer separators 201 may be patterned using, e.g., a photolithographic masking and etching process, although any suitable method may be utilized.

Once the seed layer separators 201 have been formed, the seed layer separators 201 physically separate a first portion 203 of the first seed layer 113 from a second portion 205 of the first seed layer 113. However, at this point in the process, the first portion 203 of the first seed layer 113 remains electrically connected to the second portion 205 of the first seed layer 113 for the purpose of subsequent plating processes.

Figure 3:
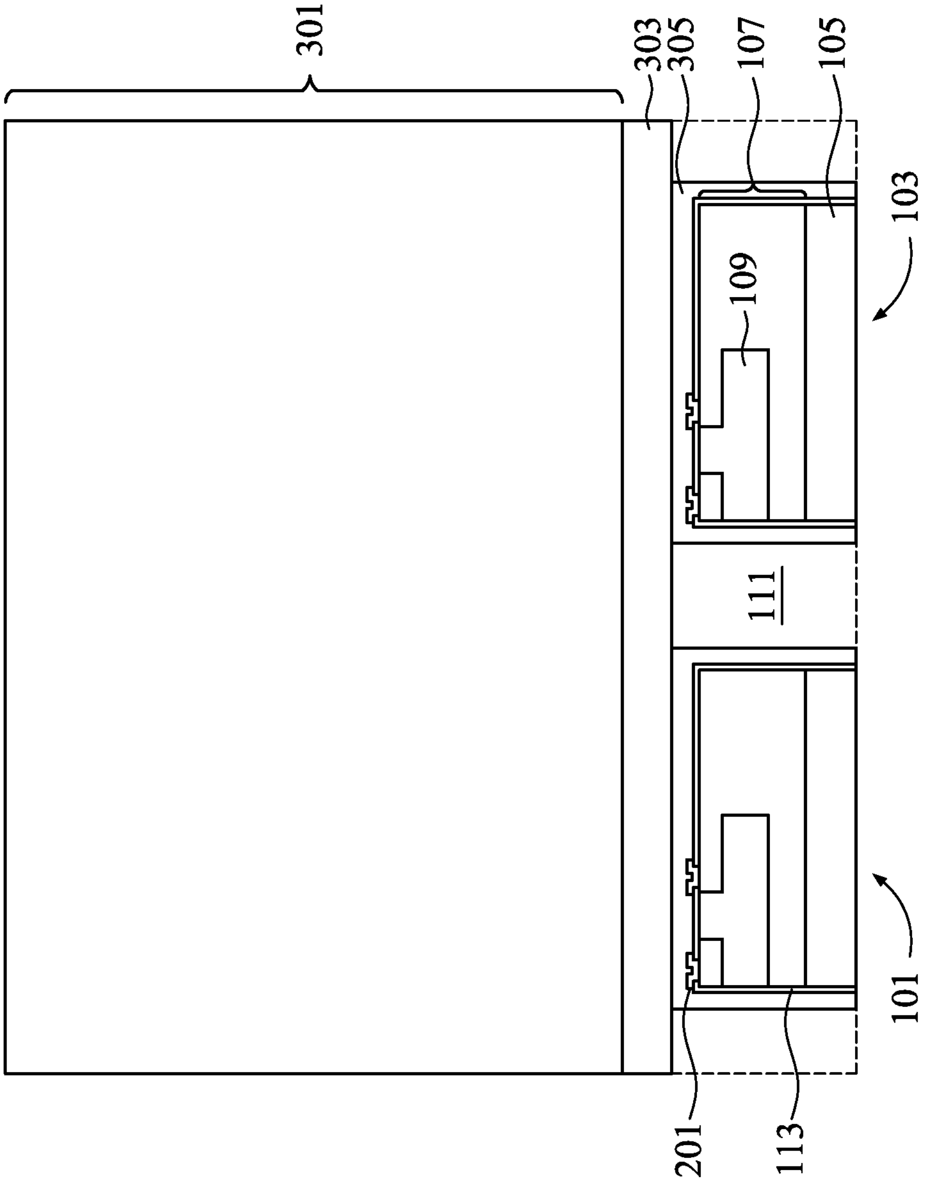
FIG. 3 illustrates placement of a mask substrate, in accordance with some embodiments.

FIG. 3 illustrates a bonding of a masking substrate 301 to the first MEMS device 101 and the second MEMS device 103 using, e.g., a cavity bonding process. In an embodiment the masking substrate 301 may be a solid material that is suitable for a subsequent etching process and, once the masking substrate 301 has been patterned, is suitable for use as a mask during a plating process. In a particular embodiment the masking substrate 301 is a material such as silicon, silicon germanium, photoresist, a patternable polymer, combinations of these, or the like. In a more particular embodiment the masking substrate 301 is a silicon wafer with a thickness of between about 30 μm and about 80 μm. However, any suitable material and any suitable thicknesses may be utilized.

In order to prepare the masking substrate 301 for bonding to the first MEMS device 101 and the second MEMS device 103, a first bonding layer 303 is formed on the masking substrate 301 for use in a fusion bonding process (also referred to as oxide-to-oxide bonding). In accordance with some embodiments, the first bonding layer 303 is formed of a silicon-containing dielectric material such as silicon oxide, silicon nitride, or the like. The first bonding layer 303 may be deposited or formed using any suitable method, such as, e.g., atomic layer deposition (ALD), CVD, high-density plasma chemical vapor deposition (HDPCVD), PVD, oxidation of the underlying material, combinations of these, or the like to a thickness of between about 1 nm and about 1000 nm, such as about 5 nm. However, any suitable material, process, and thickness may be utilized.

Additionally, a second bonding layer 305 is formed over the first seed layer 113 in order to give the first bonding layer 303 a structure to which it can bond. In an embodiment the second bonding layer 305 may be similar to the first bonding layer 303, such as by being a material such as silicon oxide deposited using a deposition process such as ALD, CVD, PVD, combinations of these, or the like. In embodiments in which CVD is utilized to deposit silicon oxide, the deposited material will not only partially fill or totally fill the via openings 111, but will also overflow to cover the surfaces of the underlying structures. Once the material has been deposited, a planarization process, such as a chemical mechanical polishing process, may be used in order to flatten the upper surface.

Once the top surface has been flattened, at least a portion of the material from the via openings 111 may be removed in order to at least partially reform the via openings 111. For example, in some embodiments a photolithographic masking and dry etching process may be utilized to remove at least some of the material from the via openings 111. As such, the cavities from the via openings 111 have been at least partially reformed prior to the remainder of the bonding process described below.

Once the first bonding layer 303 and the second bonding layer 305 have been formed, the first bonding layer 303 is bonded to the second bonding layer 305. In an embodiment the first bonding layer 303 may be bonded to the second bonding layer 305 using a fusion bond which may be initiated by first activating the first bonding layer 303 and the second bonding layer 305. Such an activation may be performed using, e.g., a dry treatment, a wet treatment, a plasma treatment, exposure to $H_2$, exposure to $N_2$, exposure to $O_2$, combinations of these, or the like. In embodiments where a wet treatment is used, an RCA cleaning may be used, for example. The activation process assists in the fusion bonding of the first bonding layer 303 and the second bonding layer 305 by, e.g., allowing the use of lower pressures and temperatures in subsequent fusion bonding processes.

After the activation process, the first bonding layer 303 and the second bonding layer 305 may be cleaned using a chemical rinse. Once cleaned, the masking substrate 301 is flipped and aligned with the first MEMS device 101 and the second MEMS device 103. Once aligned, the first bonding layer 303 and the second bonding layer 305 are brought together such that the first bonding layer 303 is in physical contact with the second bonding layer 305.

Once in physical contact, the first bonding layer 303 and the second bonding layer 305 are subjected to a thermal treatment and contact pressure to assist in the bonding process. For example, the first bonding layer 303 and the second bonding layer 305 may be subjected to a pressure of about 200 kPa or less, and a temperature between about 200° C. and about 400° C. to fuse the masking substrate 301 to the first MEMS device 101 and the second MEMS device 103. However, any suitable bonding process may be utilized to bond the first bonding layer 303 and the second bonding layer 305.

However, while a fusion bonding process is one such bonding process that may be utilized to bond the first bonding layer 303 to the second bonding layer 305, this description is intended to be illustrative and is not intended to be limiting upon the embodiments. Rather, any other suitable type of bonding, such as hybrid bonding, may also be utilized. Any suitable type of bonding process may be utilized.

Figure 4:
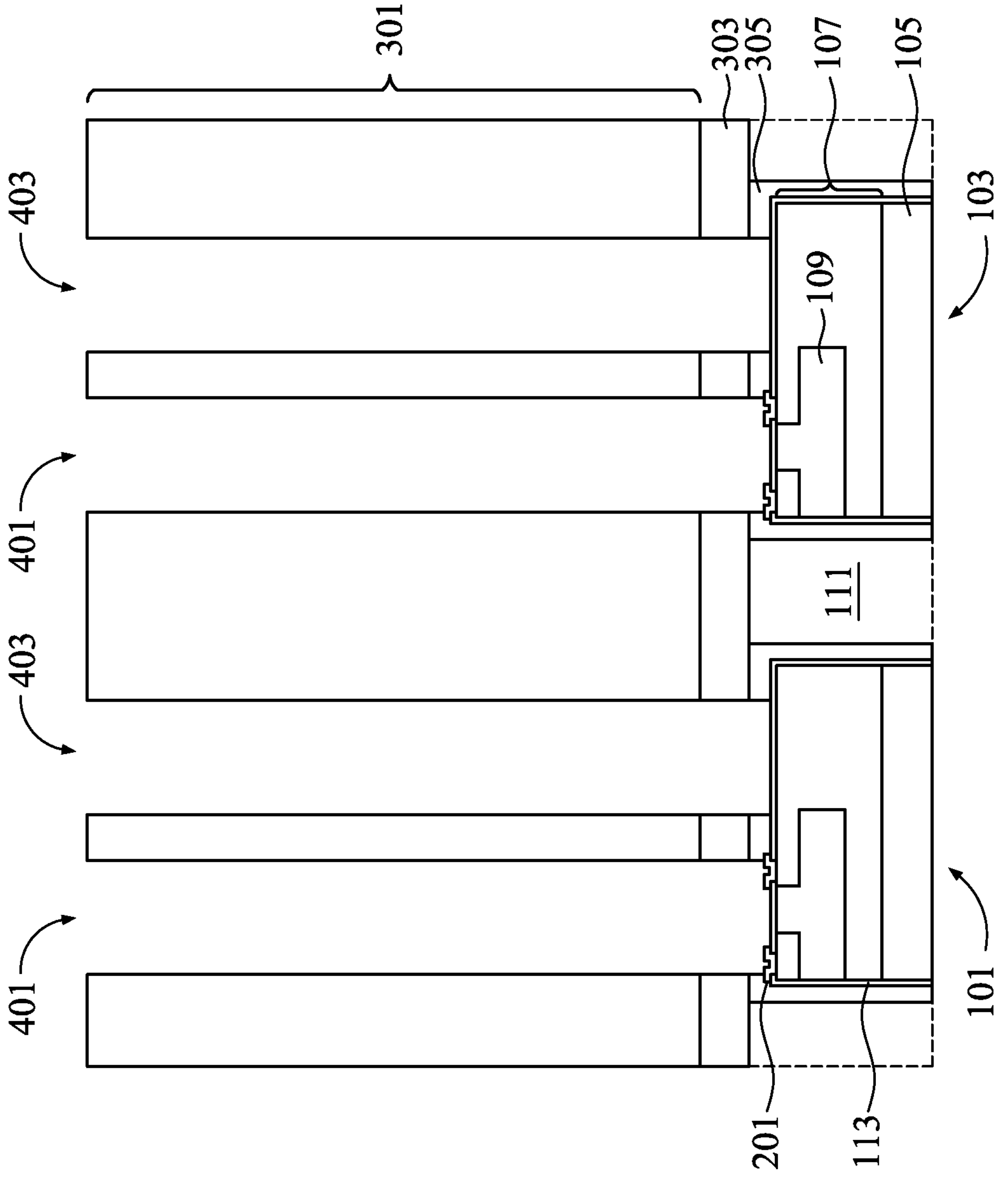
FIG. 4 illustrates a patterning of the mask substrate, in accordance with some embodiments.

FIG. 4 illustrates a patterning of the masking substrate 301 in order to form first openings 401 and second openings 403. In an embodiment the first openings 401 are formed to expose the first portion 203 of the first seed layer 113 surrounded by the seed layer separators 201 and which are electrically connected to the top metal layer 109. The second openings 403 are formed to expose the second portions 205 of the first seed layer 113 outside of the seed layer separators 201 and, in some embodiments, are not electrically connected to the top metal layer 109 except through the seed layer separators 201.

In an embodiment the masking substrate 301 is patterned using, e.g., a photolithographic masking and etching process. For example, a photoresist, such as a single layer of a photosensitive material or a tri-layer photoresist (not separately illustrated) may be placed and exposed to a patterned energy source such as light. Once exposed, the photoresist may be developed in order to transfer the pattern of the energy source to the photoresist.

Once the photoresist has been placed and patterned, the photoresist is then used in a series of one or more etching processes in order to transfer the pattern from the photoresist to the masking substrate 301. In an embodiment the one or more etching processes includes a reactive ion etching process using an etchant selective to the material of the masking substrate 301. In an embodiment in which the masking substrate 301 comprises silicon, a reactive ion etch using an etchant such as sulfur hexafluoride ($SF_6$) may be utilized. However, any suitable process and any suitable etchant may be utilized.

Additionally, once the first openings 401 and the second openings 403 have been formed through the masking substrate 301, the first openings 401 and the second openings 403 may be extended through the first bonding layer 303 and the second bonding layer 305 to expose the first seed layer 113. In an embodiment the first openings 401 and the second openings 403 may be extended using, e.g., a low-rf power, dry etching process using etchants selective to the materials of the first bonding layer 303 and the second bonding layer 305. As such, in an embodiment in which the first bonding layer 303 and the second bonding layer 305 are silicon oxide, the extension may use an etchant such as $C_xF_y$ to extend the first openings 401 and the second openings 403 through the first bonding layer 303 and the second bonding layer 305. However, any suitable processes may be utilized.

Figure 5:
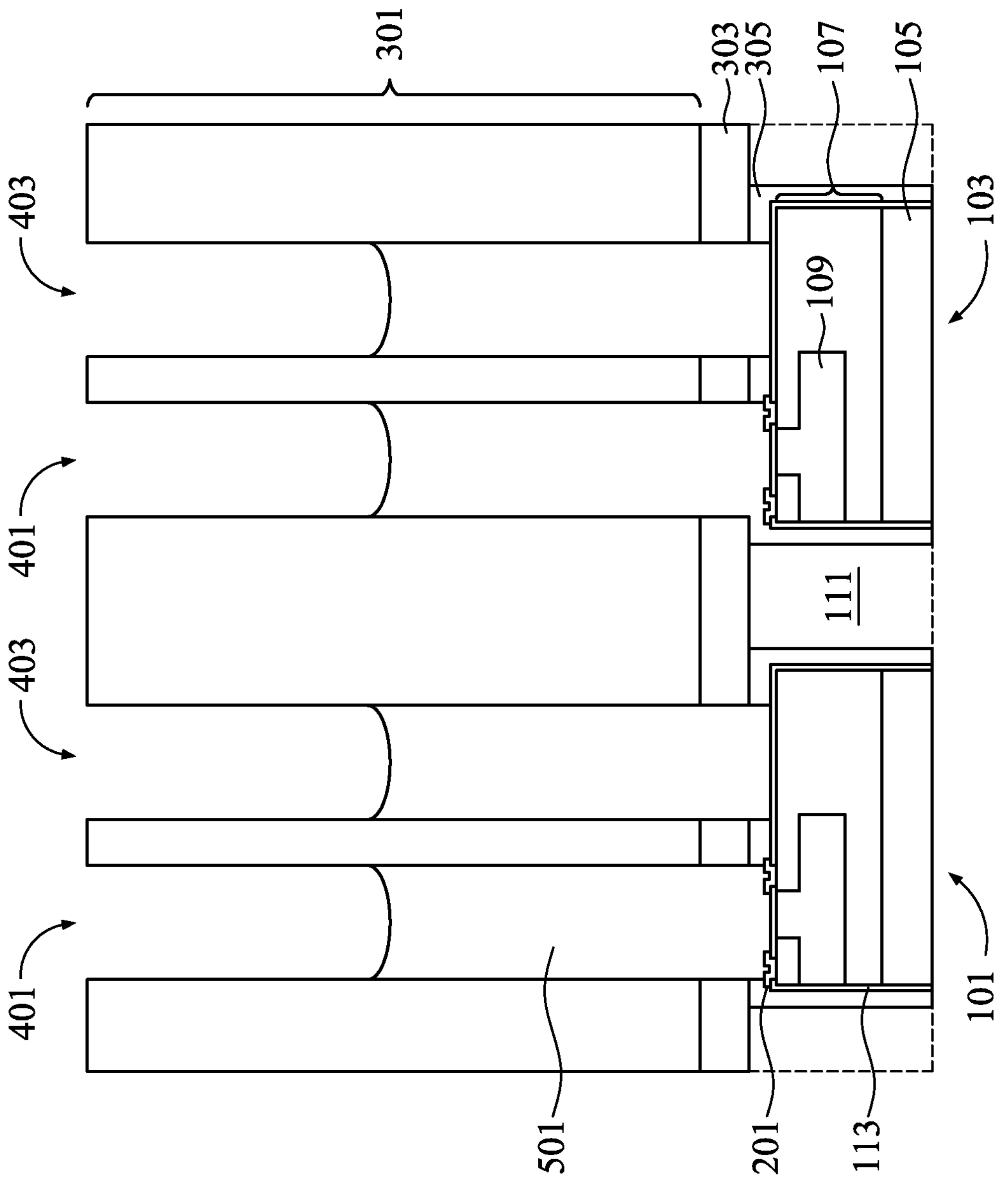
FIG. 5 illustrates a first plating process, in accordance with some embodiments.

FIG. 5 illustrates formation of first conductive pillars 501 within the first openings 401 and the second openings 403 using the masking substrate 301 as a mask. In an embodiment, once the first seed layer 113 has been exposed, the first conductive pillars 501 are deposited to fill and/or overfill the first openings 401 and the second openings 403. In an embodiment the first conductive pillars 501 comprise one or more conductive materials, such as gold, copper, tungsten, other conductive metals, or the like, and may be formed, for example, by electroplating, electroless plating, or the like. In an embodiment, an electroplating process is used wherein the first seed layer 113 is submerged or immersed in an electroplating solution. The first seed layer 113 surface is electrically connected to the negative side of an external DC power supply such that the first seed layer 113 functions as the cathode in the electroplating process. A solid conductive anode, such as a gold anode, is also immersed in the solution and is attached to the positive side of the power supply. The atoms from the anode are dissolved into the solution, from which the cathode, e.g., the first seed layer 113, acquires the dissolved atoms, thereby plating the exposed conductive areas of the first seed layer 113.

Figure 6:
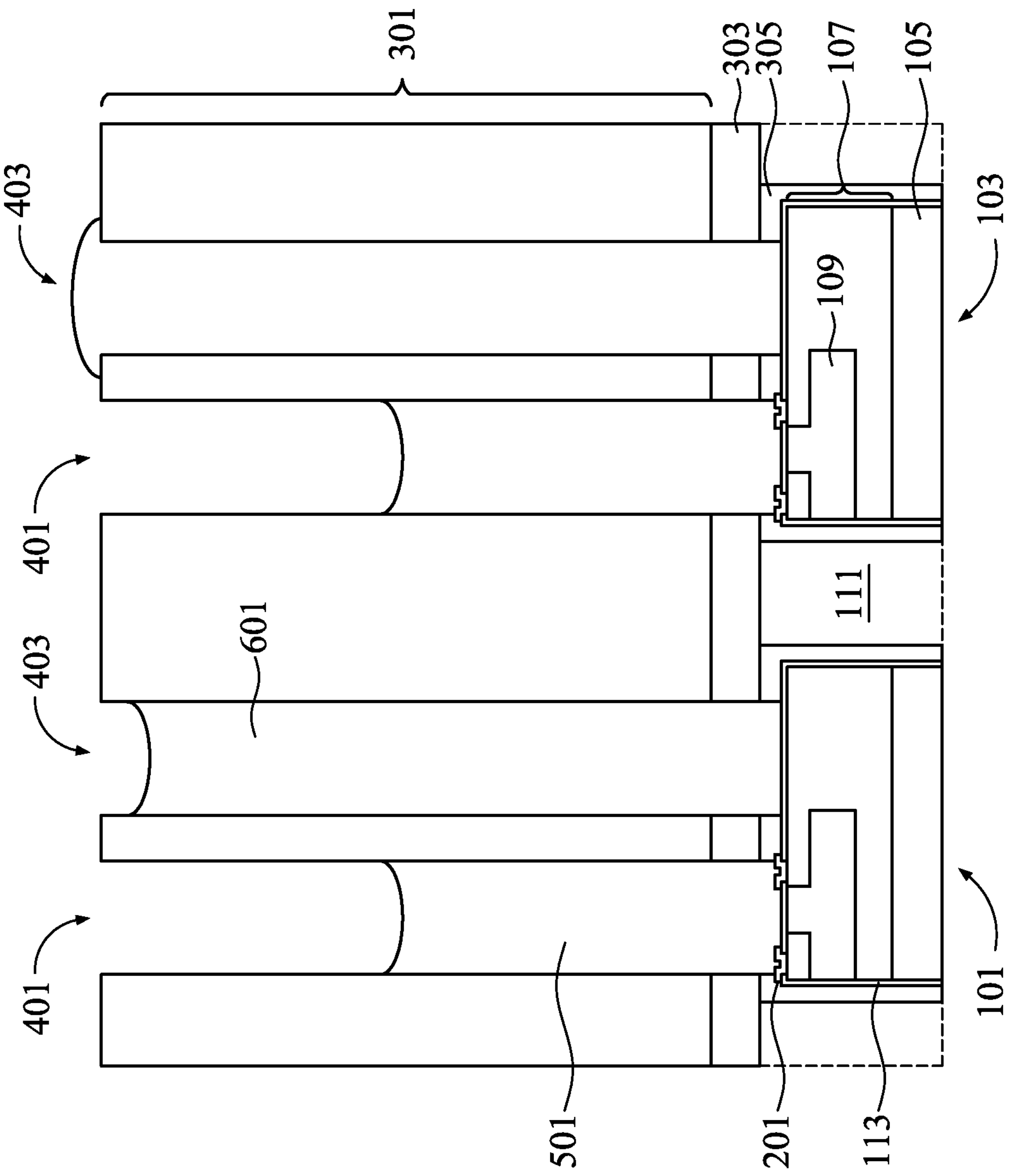
FIG. 6 illustrates a second plating process, in accordance with some embodiments.

FIG. 6 illustrates a second plating process in order to fill and/or overfill the second openings 403 with additional conductive material to form second conductive pillars 601 without adding additional conductive material to the first conductive pillars 501 within the first openings 401. In an embodiment the second plating process is initiated by first protecting the first conductive pillar 501 within the first openings 401 from additional deposition. For example, in a particular embodiment the first conductive pillars 501 within the first openings 401 are protected by placing and patterning a second photoresist (not separately illustrated) in order to fill a remainder of the first openings 401 while leaving the second openings 403 exposed.

Once the first conductive pillars 501 within the first openings 401 have been protected, the second plating process may be performed in order to fill and/or overfill a remaining portion of the second openings 403, thereby forming hybrid pillars. In an embodiment the second plating process may be similar to the first plating process (discussed above with respect to FIG. 5), such as by depositing gold or another suitable material. However, any suitable plating process and material may be utilized.

Further, in some implementations, loading effects may cause the second plating process to unevenly deposit material in different places. As such, while the second plating process may overfill a first one of the second openings 403 (thereby resulting in a mushroom shaped top surface), the second plating process may mostly, but not completely, fill a second one of the second openings 403 (thereby resulting in a hump or dimple in the top surface).

Figure 7:
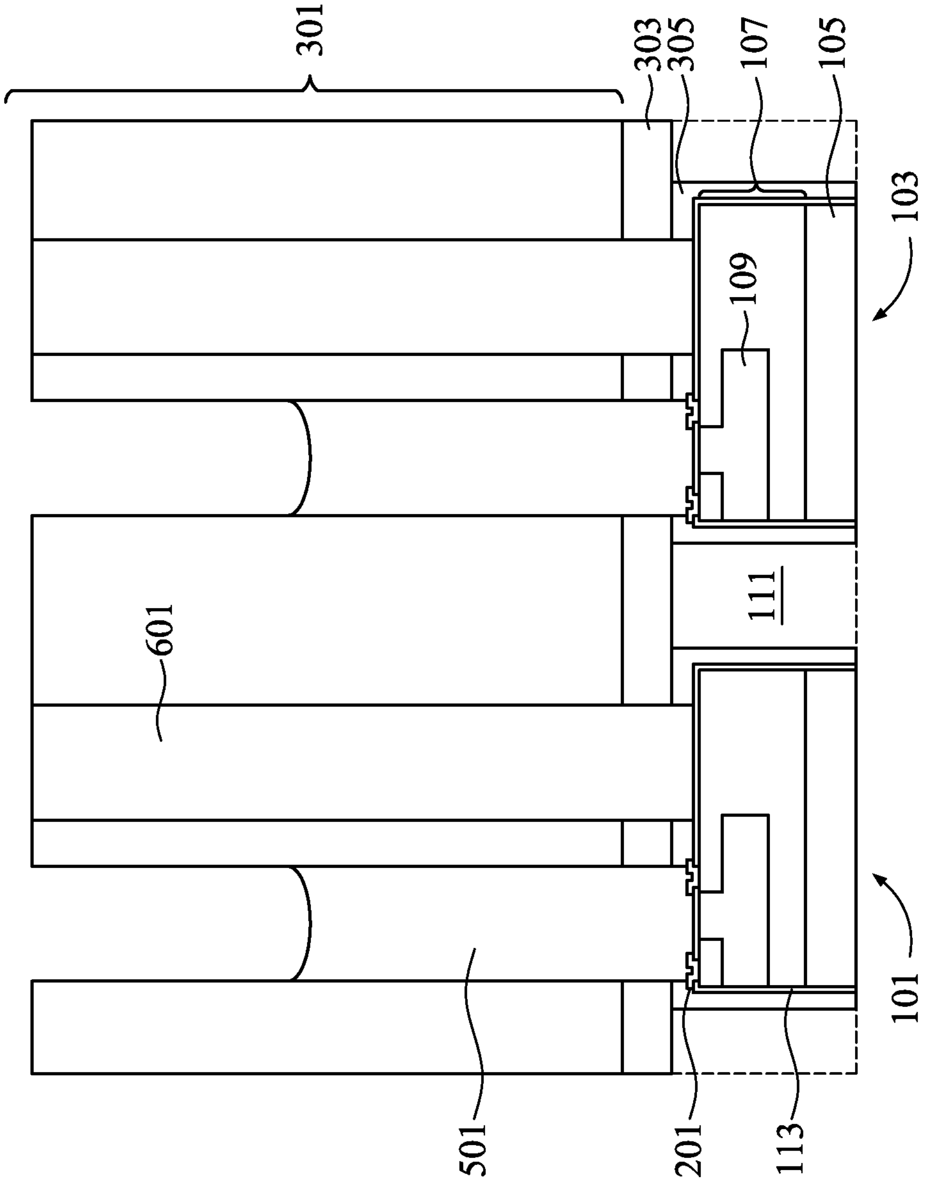
FIG. 7 illustrates a planarization process, in accordance with some embodiments.

FIG. 7 illustrates a planarization process that is used to planarize the second conductive pillars 601 with the masking substrate 301 in order to alleviate the issues caused by the loading effects and to provide for excellent control of the heights of the second conductive pillars 601. In an embodiment the planarization process may be a chemical mechanical polishing process, a grinding process, an etch-back process, combinations of these, or the like. However, any suitable planarization process may be utilized. By polishing the second conductive pillars 601, each of the second conductive pillars 601 may be formed to have flat top surfaces which are planar with each other and have a single, consistent height. Additionally, once the planarization process has been performed, the photoresist located within the first openings 401 may be removed to expose the first conductive pillars 501.

Figure 8:
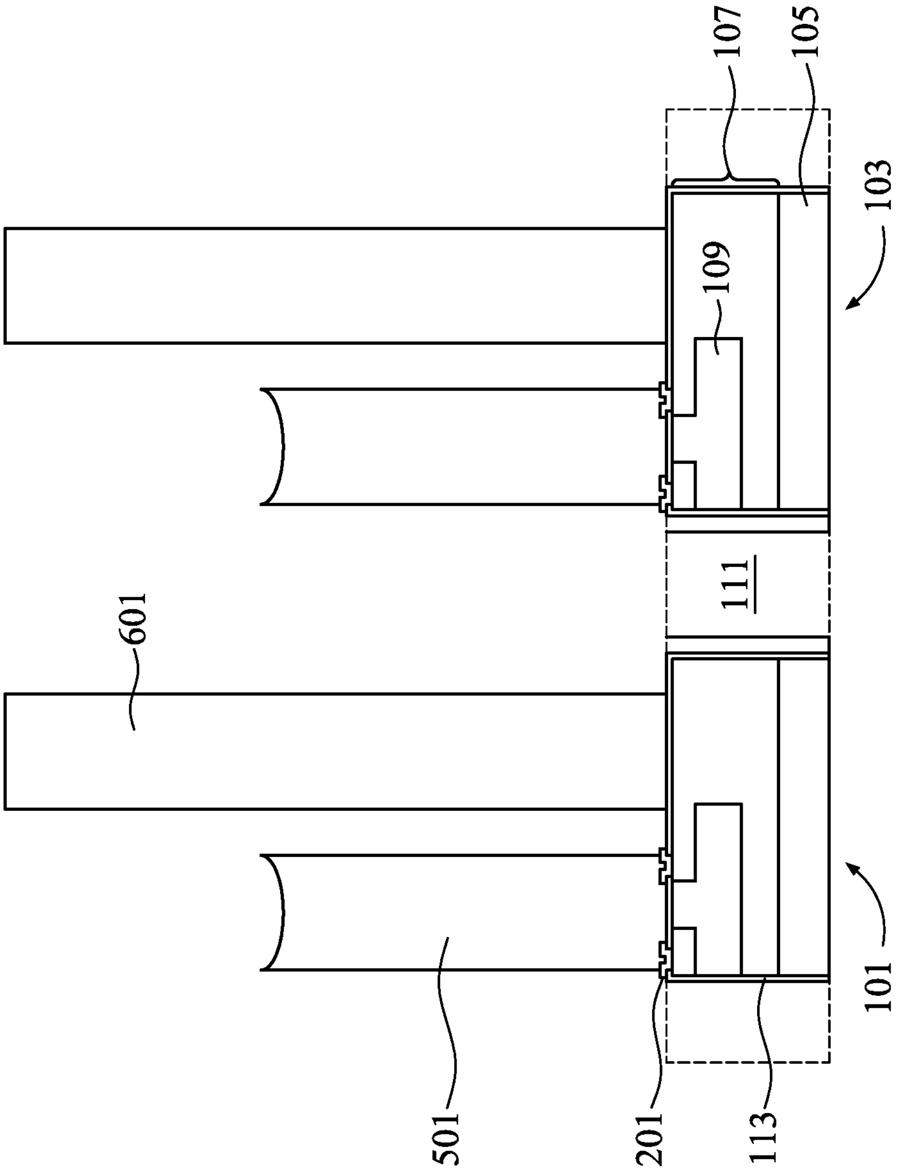
FIG. 8 illustrates a removal of the mask substrate, in accordance with some embodiments.

FIG. 8 illustrates that, once the second conductive pillars 601 have been planarized with the masking substrate 301 and with each other, the masking substrate 301, the first bonding layer 303, and the second bonding layer 305 may be removed. In an embodiment one or more etching processes, such as reactive ion etches, wet etches, combinations of these, or the like, may be utilized to remove each layer. However, any suitable removal process may be utilized.

Once the masking substrate 301, the first bonding layer 303, and the second bonding layer 305 have been removed, sidewalls of the first conductive pillars 501 are exposed. However, by using the mask substrate 301 instead of photoresists in the plating process, the sidewalls of the first conductive pillars 501 and the second conductive pillars 601 are straight and smooth instead of being jagged.

Figure 9:
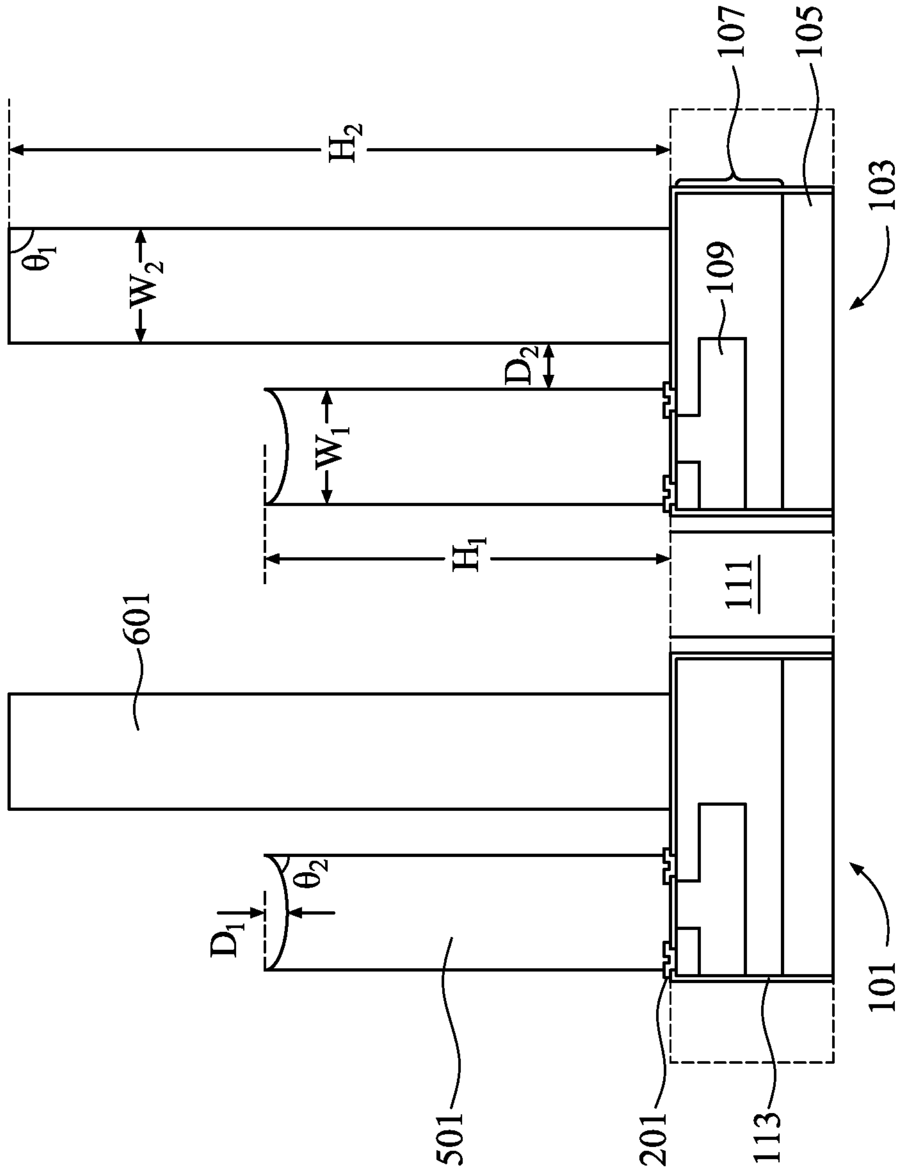
FIG. 9 illustrates a removal of the seed layer separators, in accordance with some embodiments.

FIG. 9 illustrates a removal of the seed layer separators 201 to form openings in order to electrically separate and isolate the first portions 203 of the first seed layer 113 between the first conductive pillars 501 and the top metal layer 109 from the second portions 205 of the first seed layer 113 electrically connected to the second conductive pillar 601. The formation of the openings stop on the underlying passivation layers, so may also be known as PASS openings. In an embodiment the seed layer separators 201 are removed using, e.g., a wet etching process that utilizes an etchant that is selective to the exposed material of the seed layer separators 201 without substantially removing the exposed material of the first seed layer 113. In the embodiment which utilizes a bi-layer of titanium and copper (with copper being the exposed surface) for the first seed layer 113, utilizes copper for the first conductive pillars 501, and utilizes titanium for the seed layer separators 201, a wet etchant process using an etchant such as HF and $H_2O_2$ mixed solution may be utilized. However, any suitable process and any suitable etchant may be utilized.

The removal of the seed layer separators 201 further creates indentations or openings which extend into the first conductive pillars 501 by an amount greater than zero. These indentations electrically isolate the first conductive pillars 501 from the remainder of the first seed layer 113 while leaving the first conductive pillars 501 electrically connected to the devices located within the first MEMS device 101 and the second MEMS device 103. Such a separation allows for the first conductive pillars 501 to be used as signal connections (using, e.g., an electron beam to receive signals) while the second conductive pillars 601 along with the remainder of the first seed layer 113 can be used as a ground and a shield to shield the first conductive pillars 501, the first MEMS device 101, and the second MEMS device 103.

By utilizing the processes described herein, the first conductive pillars 501 and the second conductive pillars 601 can be formed to different heights and with differently shaped top surfaces. For example, in one embodiment the first conductive pillars 501 may be formed to a first height $H_1$ of between about 25 μm and about 45 μm and a first width $W_1$ of between about 2.5 μm and about 4.5 μm. As such, the first conductive pillars 501 may have a first aspect ratio (e.g., a height/width ratio) of greater than about 4 and less than about 15.

The second conductive pillars 601, however, may be formed to different dimensions. For example, the second conductive pillars 601 may be formed to a second height $H_2$ of between about 45 μm and about 55 μm and a second width $W_2$ of between about 2.5 μm and about 4.5 μm. As such, the second conductive pillars 601 may have a second aspect ratio (e.g., a height/width ratio) of greater than about 7 and less than about 20. Further, with the use of the planarization process described above with respect to FIG. 7, the process window for the second height $H_2$ of the second conductive pillars 601 can be reduced so that a range from the desired maximum height and minimum height is less than or equal to 5 μm. However, any suitable heights may be utilized.

Additionally, by using the processes described herein, the first width $W_1$ (of the first conductive pillars 501) and the second width $W_2$ (of the second conductive pillars 601) may be the same as each other even while the first conductive pillars 501 and the second conductive pillars 601 have different heights. In some embodiments the first width $W_1$ and the second width $W_2$ may be the same within a standard deviation of less than about 0.2 μm.

Further, by being able to form the first conductive pillars 501 and the second conductive pillars 601 with such large aspect ratios, the first conductive pillars 501 and the second conductive pillars 601 may be placed closer together than previously. For example, with such large aspect ratios, the first conductive pillars 501 and the second conductive pillars 601 may be placed a second distance $D_2$ of less than about 5 μm. However, any suitable distance may be utilized.

Finally, because the planarization process described in FIG. 7 is used to reshape the second conductive pillars 601 but not the first conductive pillars 501, top surfaces of the second conductive pillars 601 may have a different shape than top surfaces of the first conductive pillars 501. For example, the top surfaces of the second conductive pillars 601 may be flat surfaces with a first angle $\theta_1$ of about 90°+/−5°. However, any suitable dimensions may be used.

However, because the top surfaces of the first conductive pillars 501 are protected during the planarization process, the top surfaces of the first conductive pillars 501 remain in the dished shape that results from the plating process. As such, the top surfaces of the first conductive pillars 501 may be dished a first distance $D_1$ of less than about 1 μm, and may have a second angle $\theta_2$ of about 90°+/−10°. However, any suitable dimensions may be used.

By utilizing the masking substrate 301 during the plating process, the formation of the first conductive pillars 501 and the second conductive pillars 601 (wherein the second conductive pillars 601 are formed with a dual damascene process) can be better controlled. In particular, the first conductive pillars 501 and the second conductive pillars 601 can be formed with straighter sidewalls at higher aspect ratios, and with a closer spacing than otherwise achievable through the use of multiple photoresists and their associated overlay issues. As such, the manufacture and electrical testing of the device can be performed more efficiently and reliably, and the overall process of manufacture can be made more efficient to manufacture smaller devices with a better yield.

In accordance with an embodiment, a method of manufacturing a semiconductor device includes: bonding a mask substrate to a first microelectromechanical system (MEMS) device; after the bonding, patterning the mask substrate; forming a first conductive pillar within the mask substrate; forming a second conductive pillar within the mask substrate, the second conductive pillar having a different height from the first conductive pillar; and removing the mask substrate. In an embodiment the method further includes planarizing the second conductive pillar but not the first conductive pillar prior to the removing the mask substrate. In an embodiment the method further includes protecting the first conductive pillar prior to the planarizing the second conductive pillar. In an embodiment after the planarizing the second conductive pillar the second conductive pillar has a top surface with a different shape from a top surface of the first conductive pillar. In an embodiment the method further includes: forming a first seed layer on the first MEMS device prior to the bonding the mask substrate; and forming a first seed layer separator prior to the bonding the mask substrate. In an embodiment the method further includes removing the first seed layer separator after the removing the mask substrate. In an embodiment the first conductive pillar plates gold within the mask substrate.

In accordance with another embodiment, a method of manufacturing a semiconductor device includes: depositing a first seed layer on a top surface and sidewalls of a first microelectromechanical system (MEMS) device; depositing a first bonding layer over the first seed layer; bonding the first bonding layer to a second bonding layer, the second bonding layer being adjacent to a mask substrate, the mask substrate includes silicon; patterning the silicon to form a first opening to the first seed layer and a second opening to the first seed layer; performing a first plating process to plate gold into the first opening to form a first conductive pillar and to plate gold into the second opening to form a first portion of a second conductive pillar; protecting the first conductive pillar; performing a second plating process to plate gold onto the first portion of the second conductive pillar to form a second portion of the second conductive pillar; and removing the mask substrate, the first bonding layer and the second bonding layer. In an embodiment the first conductive pillar has a first aspect ratio of greater than 4 and wherein the second conductive pillar has a second aspect ratio greater than the first aspect ratio and greater than 7. In an embodiment the first conductive pillar has a first width, the second conductive pillar has a second width, and the first width and the second width are the same within a standard deviation of less than about 0.2 μm. In an embodiment the method further includes chemical mechanical polishing the second conductive pillar without chemical mechanical polishing the first conductive pillar. In an embodiment the performing the first plating process forms the first conductive pillar with a dished top surface. In an embodiment the dished top surface has a recess with a distance of less than about 1 μm. In an embodiment the method further includes electrically isolating the first conductive pillar from the second conductive pillar after the removing the mask substrate.

In accordance with yet another embodiment, a semiconductor device includes: a first microelectromechanical system (MEMS) device; a first seed layer overlying a top surface of the first MEMS device, the first seed layer includes: a first portion in physical contact with a top metal structure of the first MEMS device; and a second portion electrically isolated from the first portion, the second portion extending along a sidewall of the first MEMS device; a first conductive pillar extending away from the first portion of the first seed layer a first distance, the first conductive pillar having a dished top surface; and a second conductive pillar extending away from the second portion of the first seed layer a second distance larger than the first distance, the second conductive pillar having a flat top surface. In an embodiment the dished top surface has a recess with a recess depth of less than about 1 μm. In an embodiment the first conductive pillar has a first width, the second conductive pillar has a second width, and wherein the first width and the second width are within about 0.2 μm of each other. In an embodiment the first conductive pillar is separated from the second conductive pillar by less than about 5 μm. In an embodiment the semiconductor device further includes an indentation within the first conductive pillar. In an embodiment both the first conductive pillar and the second conductive pillar comprise gold.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of manufacturing a semiconductor device, the method comprising:

bonding a mask substrate to a first microelectromechanical system (MEMS) device;

after the bonding, patterning the mask substrate to form a first opening;

after the patterning the mask substrate, plating material into the first opening to form a first conductive pillar within the mask substrate;

forming a second conductive pillar within the mask substrate, the second conductive pillar having a different height from the first conductive pillar; and removing the mask substrate.

2. The method of claim 1, further comprising planarizing the second conductive pillar but not the first conductive pillar prior to the removing the mask substrate.

3. The method of claim 2, further comprising protecting the first conductive pillar prior to the planarizing the second conductive pillar.

4. The method of claim 3, wherein after the planarizing the second conductive pillar has a top surface with a different shape from a top surface of the first conductive pillar.

5. The method of claim 1, further comprising:

forming a first seed layer on the first MEMS device prior to the bonding the mask substrate; and forming a first seed layer separator prior to the bonding the mask substrate.

6. The method of claim 5, further comprising removing the first seed layer separator after the removing the mask substrate.

7. The method of claim 1, wherein the forming the first conductive pillar plates gold within the mask substrate.

8. A method of manufacturing a semiconductor device, the method comprising:

depositing a first seed layer on a top surface and sidewalls of a first microelectromechanical system (MEMS) device;

depositing a first bonding layer over the first seed layer;

bonding the first bonding layer to a second bonding layer, the second bonding layer being adjacent to a mask substrate, the mask substrate comprising silicon;

patterning the silicon to form a first opening to the first seed layer and a second opening to the first seed layer;

performing a first plating process to plate gold into the first opening to form a first conductive pillar and to plate gold into the second opening to form a first portion of a second conductive pillar;

protecting the first conductive pillar;

performing a second plating process to plate gold onto the first portion of the second conductive pillar to form a second portion of the second conductive pillar; and removing the mask substrate, the first bonding layer and the second bonding layer.

9. The method of claim 8, wherein the first conductive pillar has a first aspect ratio of greater than 4 and wherein the second conductive pillar has a second aspect ratio greater than the first aspect ratio and greater than 7.

10. The method of claim 8, wherein the first conductive pillar has a first width, the second conductive pillar has a second width, and the first width and the second width are the same within a standard deviation of less than about 0.2 μm.

11. The method of claim 8, further comprising chemical mechanical polishing the second conductive pillar without chemical mechanical polishing the first conductive pillar.

12. The method of claim 11, wherein the performing the first plating process forms the first conductive pillar with a dished top surface.

13. The method of claim 12, wherein the dished top surface has a recess with a distance of less than about 1 μm.

14. The method of claim 8, further comprising electrically isolating the first conductive pillar from the second conductive pillar after the removing the mask substrate.

15. A method of manufacturing a semiconductor device, the method comprising:

depositing a first seed layer on a top surface and sidewalls of a first microelectromechanical system (MEMS) device;

depositing a first bonding layer over the first seed layer;

bonding the first bonding layer to a second bonding layer, the second bonding layer being adjacent to a mask substrate, the mask substrate comprising silicon;

patterning the silicon to form a first opening to the first seed layer and a second opening to the first seed layer;

performing a first plating process to plate gold into the first opening to form a first conductive pillar and to plate gold into the second opening to form a first portion of a second conductive pillar;

placing a photoresist over the first conductive pillar;

exposing the second conductive pillar through the photoresist;

performing a second plating process to plate gold onto the first portion of the second conductive pillar to form a second portion of the second conductive pillar; and removing the mask substrate, the first bonding layer and the second bonding layer.

16. The method of claim 15, wherein after the removing the mask substrate the second conductive pillar has a flat top surface.

17. The method of claim 16, wherein after the removing the mask substrate the second conductive pillar has a dished top surface.

18. The method of claim 17, wherein the dished top surface has a recess with a recess depth of less than about 1 μm.

19. The method of claim 15, wherein the first conductive pillar has a first width, the second conductive pillar has a second width, and wherein the first width and the second width are within about 0.2 μm of each other.

20. The method of claim 15, wherein the first conductive pillar is separated from the second conductive pillar by less than about 5 μm.

* * * * *